United States Patent
McClure et al.

[11] Patent Number: 6,081,466
[45] Date of Patent: Jun. 27, 2000

[54] STRESS TEST MODE ENTRY AT POWER UP FOR LOW/ZERO POWER MEMORIES

[75] Inventors: David C. McClure, Carrollton; Tom Youssef, Dallas, both of Tex.

[73] Assignee: STMicroelectronics, Inc., Carrollton, Tex.

[21] Appl. No.: 09/183,451

[22] Filed: Oct. 30, 1998

[51] Int. Cl.[7] .................................................. G11C 00/07
[52] U.S. Cl. ............................................. 365/201; 365/227
[58] Field of Search .................................... 365/201, 226, 365/227

[56] References Cited

U.S. PATENT DOCUMENTS

| | | |
|---|---|---|
| 5,341,336 | 8/1994 | McClure . |
| 5,424,988 | 6/1995 | McClure et al. ........................ 365/201 |
| 5,644,542 | 7/1997 | McClure et al. . |
| 5,703,512 | 12/1997 | McClure . |

*Primary Examiner*—Terrell W. Fears
*Attorney, Agent, or Firm*—Theodore E. Galanthay; Lisa K. Jorgenson; Andre Szuwalski

[57] ABSTRACT

A low/zero power memory device includes a deselect mode of operation wherein row decoders, column decoders, write decoders, pre-coders, post-coders and like operational circuits of the memory device needed for wordline and column activation are disabled until such time as a memory device supply voltage exceeds a certain threshold. An included test mode circuit detects test mode activation and overrides application of the power fail deselect mode of operation of the device. This activates the wordline and column related operational circuits immediately at power up such that the device powers up with multiple wordlines and columns activated and ready for application of a stress test overvoltage.

20 Claims, 2 Drawing Sheets

STRESS TEST MODE ENTRY AT POWER UP FOR LOW/ZERO POWER MEMORIES

BACKGROUND OF THE INVENTION

1. Technical Field of the Invention

The present invention relates to the testing of integrated circuits and, in particular, to the initiation of a stress test procedure in a low/zero power memory device during power up of the integrated circuit.

2. Description of Related Art

Reference is now made to FIG. 1 wherein there is shown a block diagram of a low/zero power memory device 10. The memory device 10 includes an nK×m memory array 12. As an example, the memory array may comprise a 32K×8 static random access memory (SRAM) array wherein n=32 and m=8. Other array configurations and memory devices (e.g., DRAM, ROM, and the like) may be provided for the array 12.

The memory device 10 further includes quartz controlled clock oscillator (with clock chain) 14. The memory array 12 and clock oscillator 14 are integrated on a single silicon chip, and are interconnected with each other at the upper eight memory locations within the memory array 12 comprising an m×m BiPORT(tm) array 16 in the bytes of the memory array associated with address locations 7FF8h–7FFFh. These memory locations within the memory array 12 provide user accessible clock information. This user accessible clock information comprises year, month, date, day, hour, minute and second information. It may be accessed by a user in the same manner as accessing any other stored information within the memory array 12. Timing signals for the clock oscillator 14 are supplied by a quartz crystal 18 that may be included in either the same or separate package as the memory array 12 and clock oscillator 14.

The memory device 10 is referred to as a low/zero power device because it maintains the integrity of the data stored in the memory array 12 when no (or insufficient) power is being applied to the device. To support this functionality, the memory device 10 further includes a voltage sense and switching circuit 20. The memory array 12, clock oscillator 14 and voltage sense and switching circuit 20 are integrated on a single silicon chip, and are interconnected with each other through a power supply bus 22. The voltage sense and switching circuit 20 provides power supplied from external pin power supply input 24 to the memory array 12 and clock oscillator 14 over power supply bus 22.

With a valid (i.e., at or substantially near Vcc) power supply input 24 application to the memory device 10, the memory array 12 operates in a conventional mode of operation allowing user access for read and write. Should the supply voltage provided at the power supply input 24 decay into a certain threshold range ($Vpfd_{(MIN)}$ to $Vpfd_{(MAX)}$) that is less than Vcc but greater than the voltage necessary to maintain the integrity of the data stored in the memory array 12, the voltage sense and switching circuit 20 automatically switches the memory device 10 into a power fail deselect (pfd) mode of operation. The decayed supply voltage from power supply input 24 continues to be applied over power supply bus 22 to the memory array 12 and clock oscillator 14. However, a logic level low voltage power fail deselect signal (Vpfd) 26 is also generated by the voltage sense and switching circuit 20 and applied to the memory array 12. This voltage power fail deselect signal 26 instructs the memory array 12 to enter a write protect mode where all outputs of the memory device 10 become high impedance and all inputs are treated as "don't care." In this mode, the operational circuits 27 of the memory device 10 within the array 12, such as row decoders, column decoders, write decoders, pre-coders, post-coders, and the like, are disabled.

If the supply voltage provided at the power supply input 24 should further decay below a certain threshold (Vso) that is less than $Vpfd_{(MIN)}$ and approaching the minimum voltage necessary to maintain the integrity of the data stored in the memory array 12, the voltage sense and switching circuit 20 automatically switches the memory device 10 into a sleep mode of operation wherein voltage supplied from a back-up battery 28 is applied to the power supply bus 22. The back-up battery 28 provides sufficient power to the memory device 10 to maintain the integrity of the data stored in the memory array 12. The back-up battery 28 may be included in either the same or separate package as the memory array 12, clock oscillator 14 and voltage sense and switching circuit 20.

As the supply voltage provided at the power supply input 24 thereafter returns toward Vcc and rises above Vso, the voltage sense and switching circuit 20 automatically switches the memory device 10 out of the sleep mode of operation and back into the power fail deselect mode of operation. The back-up battery 28 is disconnected, and the supply voltage provided by power supply input 24 is applied to power supply bus 22. Again, while in this mode, the row decoders, column decoders, write decoders, pre-coders, post-coders and like operational circuits 27 of the memory array 12 are disabled to provide write protection to the memory array. Write protection continues to be provided until the supply voltage provided at the power supply input 24 returns to within the threshold range ($Vpfd_{(MIN)}$ to $Vpfd_{(MAX)}$). At that point, the voltage sense and switching circuit 20 drives the Vpfd signal 26 high to automatically switch the memory device 10 out of power fail deselect mode of operation and back into the conventional mode operation.

Often, integrated circuits are tested both before and after packaging to detect latent defects. One aspect of this testing procedure is referred to as "stress testing." Stress testing of integrated circuits, such as memory devices, is typically accomplished by applying an overvoltage to the gates of the transistors in the memory array. For example, testing on a memory device rated at five volts may be performed at nine volts. To perform this test, it is common to activate multiple wordlines and columns on a simultaneous basis thus applying the testing overvoltage at each memory cell within the memory array. Defective columns and rows may then be detected. The defective portions of the device are then replaced using built-in redundancy features, or the device is discarded as defective.

With respect to low/zero power memory devices 10 like that illustrated in FIG. 1 and described above, the row decoders, column decoders, write decoders, pre-coders, post-coders and like operational circuits 27 of the memory device needed to activate multiple wordlines and columns on a simultaneous basis during stress testing are disabled until such time as the supply voltage provided at the power supply input 24 returns to within the threshold range ($Vpfd_{(MIN)}$ to $Vpfd_{(MAX)}$). Thus, the tester must first supply Vcc above the Vpfd threshold to the device in order to perform a stress test. At this point, multiple wordlines and columns may be activated and then the device is applied with the overvoltage. The subsequent simultaneous activation and/or selection of the wordlines and columns, however, in this procedure may produce a large transient current surge within the memory device potentially inducing dynamic latch-up.

There is a need then, with respect to a low/zero power memory device, for a test mode circuit that supports entry into test mode as the external power supplied to the memory device ramps up from zero volts. With such a test mode circuit, the memory device would power up with multiple wordlines and columns activated, thus avoiding dynamic latch-up inducing transient current surges.

SUMMARY OF THE INVENTION

A memory device operates in a plurality of modes including a deselect mode of operation wherein certain operational circuits of the memory device needed for wordline and column activation are disabled until such time as a memory device supply voltage exceeds a certain threshold. The memory device includes a test mode circuit that detects test mode activation and overrides the power fail deselect mode of operation. This activates the wordline and column related operational circuits immediately at power up such that the device powers up with multiple wordlines and columns activated and ready for application of a stress test overvoltage.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
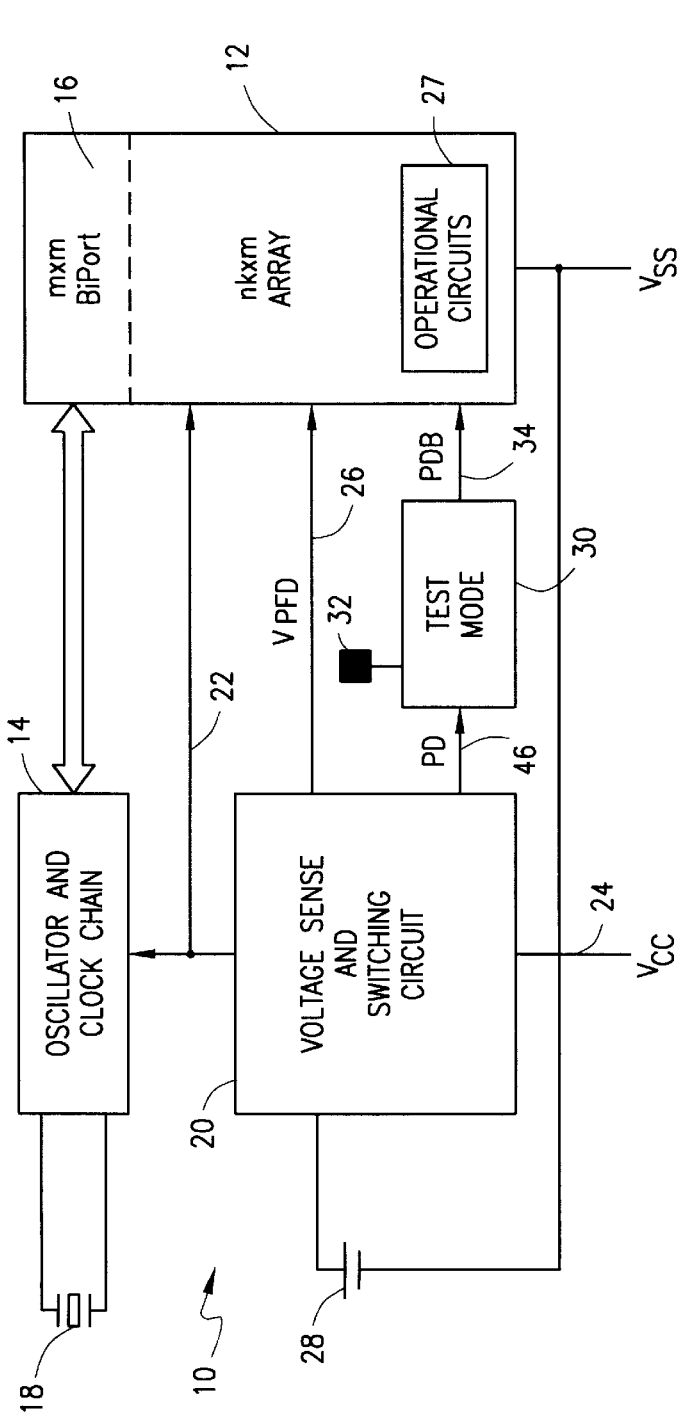
FIG. 1 (previously described in part) is a block diagram of a low/zero power memory device.

Reference is once again made to FIG. 1. The memory device 10 further includes a test mode circuit 30 in accordance with the present invention. The single silicon chip for the memory array 12, clock oscillator 14 and voltage sense and switching circuit 20 further includes a non-bonded (i.e., wafer level) test pad 32. A tester would have access to the test pad 32 on a pre-packaging basis, but a user of the memory device 10 would not in normal circumstances have access to the test pad. When a tester desires to place the memory device 10 into stress mode, test pad 32 and the power supply input 24 are ramped to an overvoltage level. The test pad 32 and the power supply input 24 simultaneously track the tester applied supply voltage ramping up from zero volts to the stress test overvoltage. When application of the supply voltage is detected at the test pad 32, the test mode circuit 30 generates and outputs an override signal (PDB) 34 that enables the row decoders, column decoders, write decoders, pre-coders, post-coders and like operational circuits 27 of the memory device 10 that are needed for memory array 12 wordline and column activation. This enabling action provided through the override signal 34 occurs well in time before the rising supply voltage returns to within the threshold range ($Vpfd_{(MIN)}$ to $Vpfd_{(MAX)}$) and conventional enablement of the operational circuits 27 for read and write occurs. It is thus recognized that the enabling action occurs prior to termination of the voltage power fail deselect signal (Vpfd) 26 by the voltage sense and switching circuit 20 when the memory device 10 would otherwise have switched out of power fail deselect mode of operation and back into the conventional mode operation (where the operational circuits 27 of the memory device 10 needed for memory array 12 wordline and column activation would otherwise have become enabled). Thus, the test mode circuit 30 overrides the voltage power fail deselect signal 26, and the memory device 10 powers up in the stress mode with multiple wordlines and columns activated and ready for application of the stress test overvoltage.

Figure 2:
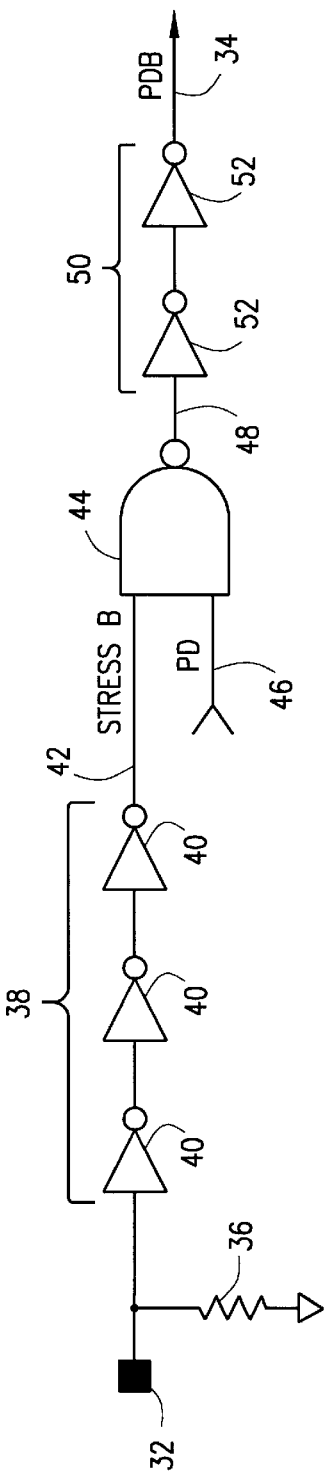
FIG. 2 is a circuit diagram for a test mode circuit in accordance with the present invention for use within the low/zero power memory device of FIG. 1.

Reference is now made to FIG. 2 wherein there is shown a circuit diagram for one example implementation of the test mode circuit 30. The test pad 32 is connected to Vss through a pull down resistor 36. The test pad 32 is further connected to a chain 38 of inverters 40. The number of inverters 40 in the chain 38 is preferably odd such that a logic level applied to the test pad 32 produces an opposite logic level at the output (STRESSB) 42 of the last inverter in the chain. The STRESSB output 42 is then gated by NAND gate 44 with a signal (PD) output from the voltage sense and switching circuit 20 (FIG. 1). The PD signal 46 is logic level high when the power supply is below the Vpfd threshold. The output 48 of the NAND gate 44 is then applied to another chain 50 of inverters 52. The number of inverters 52 in the chain 50 is preferably even such that a logic level of the output 48 from the NAND gate 44 produces an identical logic level at the output (PDB) 34 of the last inverter in the chain. The PDB output 34, as described above, when high comprises an enabling signal that enables the row decoders, column decoders, write decoders, pre-coders, post-coders and like operational circuits 27 of the memory device 10 that are needed for memory array 12 wordline and column activation. In addition, all addresses are conditioned for multiple row and column selection. When the PDB signal 34 high is generated, the operational circuit 27 enable control exercised by the voltage power fail deselect signal 26 is overridden, and the memory device 10 powers up in the stress mode with multiple wordlines and columns activated and ready for application of the stress test overvoltage.

In normal operation, the test pad is connected to Vss through the pull down resistor 36. The first chain 38 of inverters 40 accordingly outputs a high STRESSB signal 42. This logic level high signal is then applied to one input of the NAND gate 44. At the other input, the NAND gate receives the PD signal. If the power supply is below the Vpfd threshold, then the PD signal and STRESSB signal 42 are both high resulting in the NAND gate 44 output 48 being low. The second chain 50 of inverters 52 accordingly also outputs a low PDB signal 35. This low PDB signal 35 does not enable the row decoders, column decoders, write decoders, pre-coders, post-coders and like operational circuits 27 of the memory device 10. If, however, the tester should then apply the supply voltage to the test pad 32, this would drive the test pad high and generate a low STRESSB signal 42 output for application to the NAND gate 44. With the STRESSB signal 42 low, and the PD signal still high because the power supply is below the Vpfd threshold, the NAND gate 44 output 48 goes high. The second chain 50 of inverters 52 accordingly also outputs a high PDB signal 35. This high PDB signal 34 enables the row decoders, column decoders, write decoders, pre-coders, post-coders and like operational circuits 27 of the memory device 10. Significantly, if this activity is performed as the power supply is ramped from a ground potential to an overvoltage potential, this enablement occurs before Vpfd is reached.

This enablement occurs long before the voltage sense and switching circuit 20 detects the rising supply voltage return to being above the threshold range (Vpfd$_{(MIN)}$ to Vpfd$_{(MAX)}$) and generates an active high power fail deselect signal PDB 34. Thus, the PDB signal 34 in effect overrides a high PD signal 46, allowing the memory device 10 to power up in the stress mode with multiple wordlines and columns activated and ready for application of the stress test overvoltage.

Figure 3:
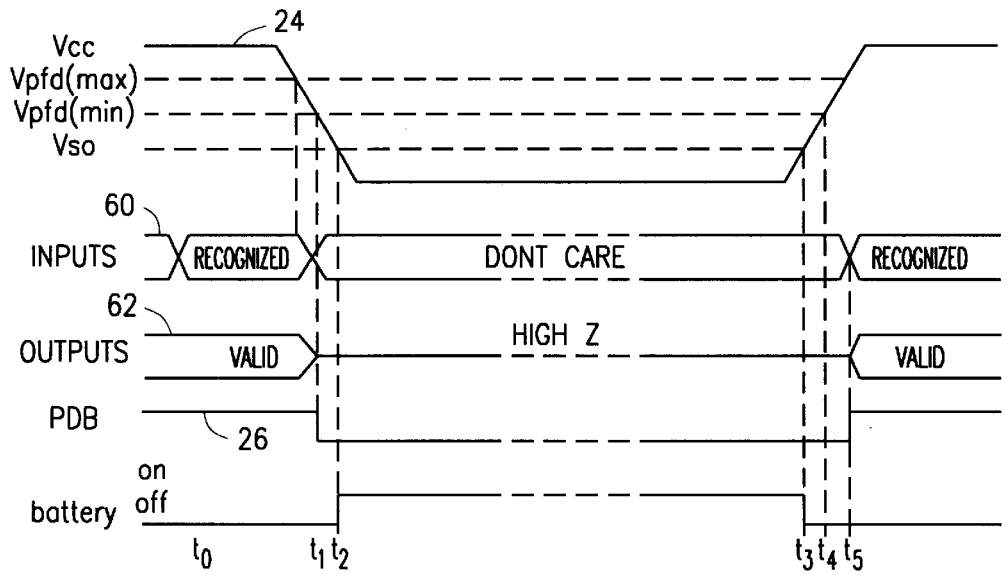
FIG. 3 is a power down/up timing diagram illustrating operation of the memory device in accordance with the present invention.
Figure 4:
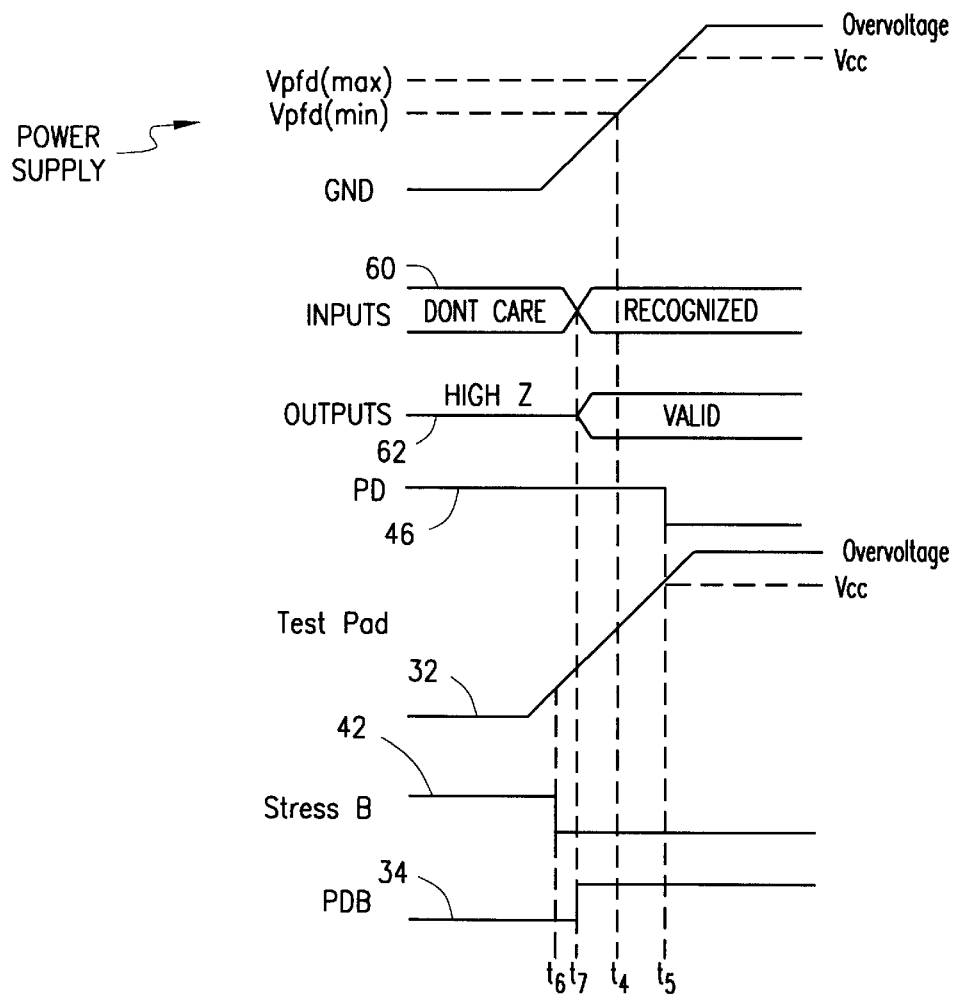
FIG. 4 is a timing diagram illustrating the memory device powering up in the stress test mode in accordance with the present invention.

Reference is now made to FIGS. 3 and 4 wherein there are shown power down/up timing diagrams illustrating operation of the memory device in accordance with the present invention. More specifically, FIG. 3 illustrates conventional power down/up device operation and FIG. 4 illustrates test mode power up operation using the test mode circuit of FIG. 2.

Turning first to the power down process illustrated in FIG. 3, at time $t_0$ the power supply 24 voltage is at Vcc. The PDB signal 34 is accordingly high which places the memory device in a normal operation mode wherein the row decoders, column decoders, write decoders, pre-coders, post-coders and like operational circuits of the memory device are enabled. When in this mode, the inputs 60 to the memory device are recognized and outputs 62 from the memory device are valid. At time $t_1$, the power supply 24 voltage drops to within or below the threshold range (Vpfd$_{(MIN)}$ to Vpfd$_{(MAX)}$). The PDB signal 34 is then driven low which places the memory device in a power fail deselect mode of operation wherein the row decoders, column decoders, write decoders, pre-coders, post-coders and like operational circuits of the memory device are disabled. When in this mode, the inputs 60 to the memory device are "don't care" and outputs 62 from the memory device are in high impedance. At time $t_2$, the power supply 24 voltage drops below the Vso threshold. The memory device is then placed into a sleep mode of operation and the voltage sense and switching circuit switches from the power supply 24 to the back up battery 28 to power the memory device.

Moving on now to the power up process illustrated in FIG. 3, at time $t_3$, the power supply 24 voltage rises above the Vso threshold. The memory device switches back to the power fail deselect mode of operation and the voltage sense and switching circuit switches from the back up battery 28 to the power supply 24. The PDB signal 34, however, remains low which disables the row decoders, column decoders, write decoders, pre-coders, post-coders and like operational circuits of the memory device. When in this mode, the inputs 60 to the memory device are "don't care" and outputs 62 from the memory device are in high impedance. At time $t_4$, the power supply 24 voltage rises to within or above the threshold range (Vpfd$_{(MIN)}$ to Vpfd$_{(MAX)}$). At that time, or at a slightly delayed therefrom time $t_5$ (as illustrated), the PDB signal 34 is then driven high which places the memory device back into the normal operation mode wherein the row decoders, column decoders, write decoders, pre-coders, post-coders and like operational circuits of the memory device are enabled. When in this mode, the inputs 60 to the memory device are recognized and outputs 62 from the memory device are valid.

Now, with respect to the test mode power up process illustrated in FIG. 4, the test pad 32 is normally held low. This produces a high STRESSB signal 42 and a low PDB signal 34. To engage in a stress test, the test pad 32 and the power supply 24 are simultaneously applied by the tester with the same voltage which correspondingly rises to an overvoltage level that exceeds Vcc. At time $t_6$, the rising voltage at the test pad 32 causes the STRESSB signal 42 output from the first chain of inverters to go low. Very shortly thereafter, at time $t_7$, the PDB signal 34 switches to high. The PDB signal going high then overrides the PD signal 46 (which is still high) and places the memory device in a normal operation mode wherein the row decoders, column decoders, write decoders, pre-coders, post-coders and like operational circuits of the memory device are enabled even though the power supply is below the Vpfd threshold. When in this mode, the inputs 60 to the memory device are recognized and outputs 62 from the memory device are valid. It is not until later time $t_4$, or at a slightly delayed therefrom time $t_5$ (as illustrated), when the power supply 24 voltage rises to within the threshold range (Vpfd$_{(MIN)}$ to Vpfd$_{(MAX)}$) and the PD signal 46 is driven low. With the addresses being conditioned for multiple row and column selection, the memory device accordingly powers up with the test mode circuit of the present invention in the stress mode with multiple wordlines and columns activated and ready for application of the stress test overvoltage.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory device, comprising:

a memory array for storing information, the memory array including operational circuits for controlling wordline and column activation;

means for placing the memory device into a deselect mode of operation wherein the operational circuits needed for wordline and column activation are disabled until an external pin application of a memory device supply voltage exceeds a first threshold; and a test mode circuit for detecting test mode activation when a voltage appearing on a test pad of the memory device exceeds a second threshold and then overriding the deselect mode of operation to activate the wordline and column related operational circuits at memory device power up such that the device powers up with multiple wordlines and columns activated and ready for application of a stress test overvoltage.

2. The memory device as in claim 1 wherein the test mode circuit comprises:

a resistive element connected to the test pad;

a first logic circuit having an input connected to the test pad and having an output;

a second logic circuit having a first input connected to the output of the first logic circuit, a second input for receiving a mode signal relating to memory device mode of operation, and having and an output for generating a signal for overriding the deselect mode of operation.

3. The memory device as in claim 2 wherein the first logic circuit comprises a chain of inverters having an odd number of individual inverters.

4. The memory device of claim 2, wherein the second logic circuit includes a first logic gate.

5. The memory device as in claim 4 wherein the second logic circuit further includes a chain of inverters having an input connected to the output of the first logic gate and an output which generates the signal for overriding the deselect mode of operation.

6. The memory device as in claim 4, wherein the first logic gate comprises a NAND gate.

7. The memory device of claim 6, wherein the mode signal is applied to the second input of the NAND gate and identifies whether the memory device is in the sleep mode of operation.

8. The memory device as in claim 1, further including:
a means for placing the memory device in a sleep mode of operation powered by a back up battery when the external pin application of the memory device supply voltage falls below a third threshold.

9. The memory device as in claim 8, wherein the third threshold is less than the first threshold.

10. The memory device as in claim 1 wherein the second threshold is less than the first threshold.

11. A memory device, comprising:
a memory array for storing information, the memory array including operational circuits for controlling wordline and column activation;
a voltage sense and switching circuit responding to an external pin application of a memory device supply voltage below a first threshold with the generation of a mode control signal for disabling the operational circuits of the memory array needed for wordline and column activation; and
a test mode circuit responding to a test pad of the memory device having a voltage appearing thereon which is in excess of a second threshold, wherein the second threshold is less than the first threshold, with the generation of a signal for overriding the mode control signal output from the voltage sense and switching circuit and enabling the operational circuits of the memory array needed for wordline and column activation at memory device power up such that the device powers up with multiple wordlines and columns activated and ready for application of a stress test overvoltage.

12. The memory device of claim 11, wherein the test mode circuit comprises:
a first circuit having a first input coupled to the test pad, a second input for receiving a mode signal relating to the memory device mode of operation, and having an output which generates a signal for overriding the deselect mode of operation.

13. The memory device of claim 12, wherein the first circuit comprises:
a first logic gate having a first input coupled to the test pad, a second input for receiving a mode signal relating to the memory device mode of operation and an output; and
at least one second logic gate having an input connected to the output of the first logic gate and an output which generates the signal for overriding the deselect mode of operation.

14. The memory device of claim 13, wherein the at least one second logic gate comprises an inverter chain.

15. The memory device of claim 13, wherein the first logic gate comprises a NAND gate.

16. The memory device of claim 12, wherein the test mode circuit further comprises:
a second circuit having a first input connected to the test pad and an output connected to the input of the first circuit.

17. A method for memory device operation, comprising the steps of:
placing the memory device in a deselect mode of operation wherein certain operational circuits needed for wordline and column activation are disabled for so long as an external pin application of a memory device supply voltage is less than a first threshold;
detecting a voltage appearing on a test pad of the memory device being in excess of a second threshold, wherein the second threshold is less than the first threshold; and
responsive to an affirmative detection, overriding the placing of the memory device in the deselect mode of operation in order to activate the certain operational circuits at memory device power up such that the device powers up with multiple wordlines and columns activated.

18. The method as in claim 17 further including the step of applying a stress test overvoltage to the test pad and external pin.

19. The method of claim 17, further including the steps of:
ramping the voltage supply for the memory device from a substantially ground potential; and
ramping the voltage appearing on the test pad substantially concurrently with the step of ramping the voltage supply for the memory device.

20. The method of claim 17, further including the steps of:
generating a detection signal indicative of the voltage on the test pad being in excess of a second threshold during the step of detecting;
detecting a supply voltage for the memory device being in excess of the first threshold;
generating a mode signal indicative of the supply voltage for the memory device being in excess of the first threshold; and
the step of overriding includes the steps of gating the detection signal with the mode signal and generating a signal to activate the certain operational circuits at memory device power up.

* * * * *